Nov. 26, 1963 E. D. OSTROFF 3,112,478

FREQUENCY RESPONSIVE APPARATUS

Filed Jan. 7, 1959

INVENTOR.
EDWARD D. OSTROFF
BY

ATTORNEY 3,112,478
FREQUENCY RESPONSIVE APPARATUS
Edward D. Ostroff, South Sudbury, Mass., assignor to Laboratory For Electronics, Inc., Boston, Mass., a corporation of Delaware
Filed Jan. 7, 1959, Ser. No. 785,449
8 Claims. (Cl. 340—347)

The present invention relates in general to frequency control systems and more particularly concerns novel apparatus providing an output signal having a rate which accurately follows the frequency of an input signal, despite wide and rapid variations of the input signal frequency. Additionally, the frequency of the input signal is converted into a digital number continuously available in parallel binary notation.

The present invention contemplates and has as a primary object the provision of an output signal having a rate corresponding to the frequency of an input signal and capable of following wide and rapid fluctuations of the input signal frequency.

Another important object of the invention is to characterize the input signal frequency by a digital number available in parallel binary notation.

It is a further object of the invention to achieve the foregoing objects with reliably operating apparatus yielding accurate output indications and virtually insensitive to nearly all parameter variations in the frequency control system.

It is another object of the invention to provide a telemetering system in which a digital signal corresponding to the current value of the telemetered quantity is continuously available in parallel binary notation.

It is an object of the invention to provide the parallel binary representation indicated above while eliminating hunting in the least significant digit of such digital signal while still indicating the binary number most nearly representative of the input frequency or telemetered quantity.

According to the invention, means are provided for altering the frequency of an input reference signal in accordance with a frequency control signal representing a digital number in parallel binary form to provide the output signal. The output signal is combined with the input signal to provide a first signal having a frequency equal to the difference between the frequencies of the input and output signals. The frequency of the output signal is reduced to provide a second signal which is combined with the first signal to provide a control signal for altering the said digital number until the electrical representation thereof causes the output frequency to be substantially the same as the input signal frequency. There is then available the parallel binary representation of the said digital number which corresponds to the ratio between input signal frequency and reference signal frequency. If the reference signal frequency and the input signal frequency are controlled by reference and variable quantities, respectively, the apparatus functions effectively as an analog to digital converter especially useful in telemetering applications wherein the digital representation of the variable quantity is continuously available in parallel binary form.

Other features, objects and advantages of the invention will become apparent from the following specification when read in connection with the accompanying drawing in which.

Since the preferred embodiment of the invention operates on signals in pulse form, the term "rate" is frequently used herein to denote the pulse repetition rate. Thus, the terms "rate" and "frequency" are interchangeable.

Figure 1:
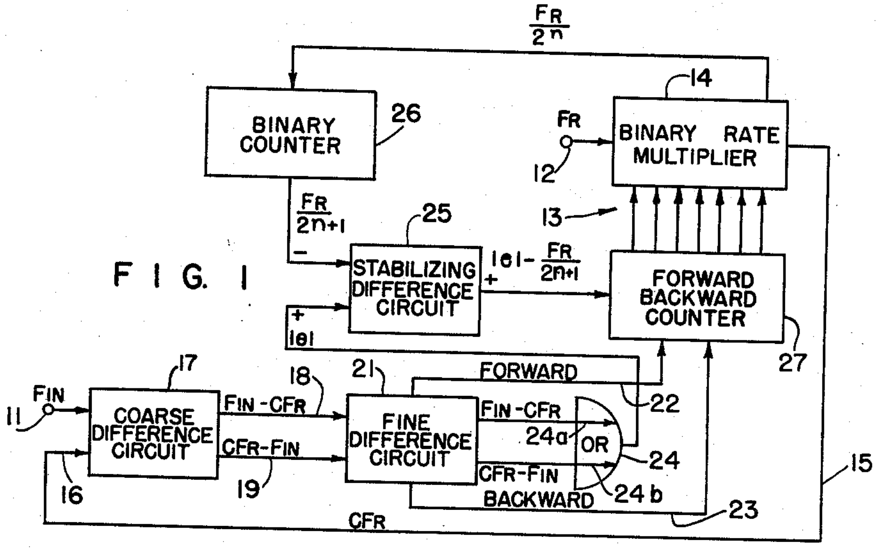
FIG. 1 is a block diagram showing the logical arrangement of an embodiment of the invention.

With reference now to the drawing and more particularly FIG. 1 thereof, a block diagram of an operational digital servo follower arranged according to the invention is shown. An input signal having a rate, $F_{in}$, is applied to terminal 11, a reference signal having a rate, $F_R$, is applied to terminal 12, and the ratio therebetween is binarily represented by the state of the potentials on the rate control input leads 13 of a binary rate multiplier 14.

A binary rate multiplier provides a signal at its output having a rate equal to the rate of an input signal applied to its rate input multiplied by the digital number electrically represented by the potentials in parallel binary notation applied to the rate control input leads. The rate multiplier includes as many cascaded binary counter stages as there are rate control leads and digits in the binary number electrically represented by signals applied to the rate control leads. For further details of a binary rate multiplier, reference is made to a paper of Maurice A. Meyer and Bernard M. Gordon entitled Operational Digital Feedback Divider in the IRE Transactions on Computers for March 1954.

Designating the digital number electrically represented on the rate control input leads 13 as C, the rate of the output signal provided on line 15 from binary rate multiplier 14 is $CF_R$. This output signal is applied to the input 16 of coarse differencing circuit 17. The other input to this circuit is the input signal applied on terminal 11. If the rate $F_{in}$ is higher than the rate $CF_R$, line 18 delivers a pulse train having a rate equal to the difference between these rates. If the rate $F_{in}$ is lower than the rate $CF_R$, line 19 delivers a pulse train having a rate equal to the difference therebetween.

If that one of the signals applied to differencing circuit 17 which actually has the lower rate with respect to a relatively long time interval develops a burst of pulses during a relatively short time interval between consecutive pulses of the signal actually having the higher rate, the incorrect one of lines 18 and 19 is energized. To eliminate the effects of this short term instability, the pulse trains on lines 18 and 19 are delivered to a fine differencing circuit 21 which provides an activating potential on one of forward and backward lines 22 and 23 when the rate $F_{in}$ is respectively greater and less than the rate $CF_R$. The significance of these potentials will become apparent from the discussion below.

The signal of difference rate on the activated one of output lines 24a and 24b is coupled by buffer 24 to a stabilizing differencing circuit 25. This rate is equal to the magnitude of the difference between the output signal rate and the input signal rate and is designated |e|. The other input to the stabilizing differencing circuit 25 is energized by a pulse train having a rate equal to $$\frac{F_R}{2^{N+1}}$$

The signal of this rate is provided by a binary counter stage 26 energized by the output of the last counter stage in binary rate multiplier 14. N denotes the number of cascaded binary counter stages in rate multiplier 14 and the number of rate control input leads 13.

The stabilizing differencing circuit 25 provides an output pulse for altering the count C of forward-backward counter 27 only when the error rate is greater than $F_R/2^{N+1}$. As a result, error frequencies corresponding to values within plus or minus one-half of the least significant digit indicated by forward-backward counter 27 are allowed to exist in the feedback loop without altering the setting of forward-backward counter 27. This type of operation prevents the least significant digit from hunting and moreover, ensures that the least significant digit indicated by the counter 27 is the one most nearly characteristic of the ratio between input signal and reference signal rates. The significance of the activating potentials on forward and backward lines 22 and 23 now becomes apparent for such potentials control whether the count in counter 27 is retarded or advanced in order to maintain the count most nearly representative of the aforesaid ratio.

Figure 2:
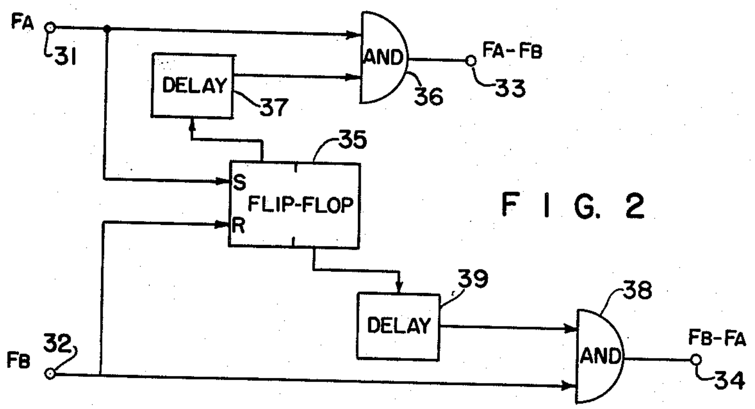
FIG. 2 is a block diagram of a preferred embodiment of the differencing circuit shown in FIG. 1.
Figure 3:
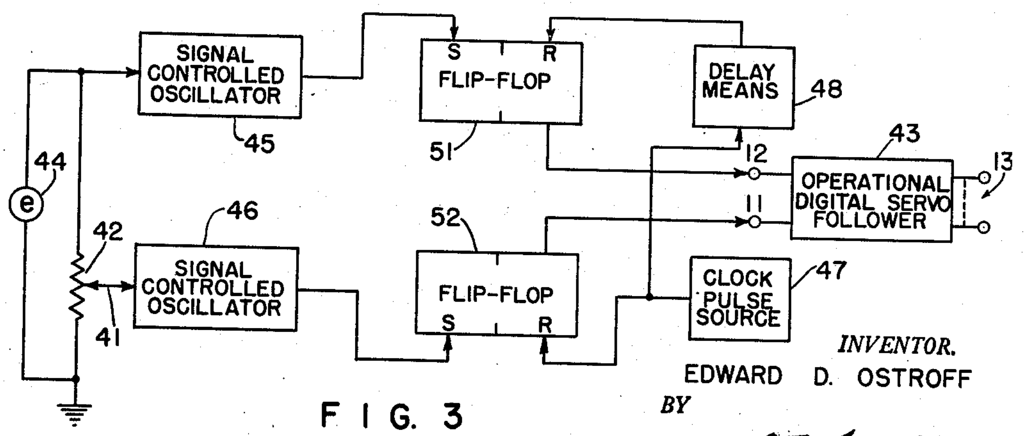
FIG. 3 is a block diagram illustrating the logical arrangement of a telemetering system incorporating the principles of the invention.

Referring to FIG. 2, there is shown a block diagram of a preferred embodiment of the differencing circuits 17, 21 and 25. First and second pulse trains having rates $F_A$ and $F_B$, respectively, are applied to respective input terminals 31 and 32 to provide a rate equal to the difference therebetween on output terminals 33 and 34 when $F_A$ is respectively larger and smaller than the rate $F_B$. The pulses applied to terminals 31 occur noncoincidentally with the pulses applied to terminal 32. A suitable system for insuring that the pulses in the A and B trains are time-spaced is shown in FIG. 3 and described below. An A pulse sets flip-flop 35 to enable gate 36 after a delay interval furnished by delay means 37. If an A pulse is applied to terminal 31 before the occurrence of the next B pulse, this A pulse passes through the enabled gate 36 to output terminal 33. All succeeding A pulses are passed through gate 36 to terminal 33 until a B pulse is applied to terminal 32. Flip-flop 35 is then reset, thereby disabling gate 36 and enabling gate 38 after a time interval furnished by delay means 39. Any succeeding B pulses pass through gate 38 to output terminal 34 until the next A pulse is applied to terminal 31. It is to be observed that because of the delay furnished by the delay means 37 and 39, the A and B pulses which set and reset flip-flop 35 are not passed by gates 36 or 38. Hence, if both pulse trains occur at the same rate, no output pulses will be provided, correctly indicating that the frequency difference between the input pulse trains is zero. Thus, the differencing circuit is operative over a very wide range of difference frequencies down to zero. It should also be noted that the pulse train having the lower rate normally will not pass pulses through its associated gate 36 or 38. By cascading two circuits of the type shown in FIG. 2, buffer 24 does not receive an output pulse from a line 24*a* or 24*b* until at least two pulses have previously been delivered in succession on terminal 11 or line 16.

The Forward line 22 and Backward line 23 may receive enabling potentials from delay means 37 and 39, respectively, for controlling the direction in which the count of forward-backward counter 27 is altered.

The stabilizing difference circuit 25 is arranged so that only AND gate 36 provides output pulses. These pulses occur only if the error signal provided by buffer 24 is greater than the reference frequency divided by $2^{N+1}$ provided by binary counter 26. This means that forward-backward counter 27 does not change its count until there is a change in the input signal frequency representable by the least significant bit of the digital number stored therein. Moreover, this count is always nearly representative of the actual frequency applied to terminal 11.

Referring to FIG. 3, there is shown a block diagram illustrating the logical arrangement of a telemetering system utilizing the operational digital servo follower shown in FIG. 1 for telemetering whereby the position of arm 41 of a potentiometer 42 moved by a shaft or other means is continuously represented as a digital number available in parallel binary notation on output lines 13. The reference numerals used in FIG. 1 identify corresponding elements in FIG. 3. Thus, the output lines 13 are the rate control input lines 13 coupling the electrical representation of the count in forward-backward counter 27 to rate multiplier 14. The operational digital servo follower 43 is the system shown in FIG. 1 with terminal 11 adapted to receive the variable input frequency while terminal 12 receives the reference frequency.

A signal source 44 is applied across potentiometer 42 and controls the frequency of signal controlled oscillator 45 while the frequency of signal controlled oscillator 46 is determined by the position of arm 41. The ratio of the output frequencies from oscillators 45 and 46 corresponds to the ratio of the impedance between ground and arm 41 to the total impedance of potentiometer 42, regardless of variations in the amplitude of the signal provided by source 44.

The signal controlled oscillators 45 and 46 are preferably made of like elements so that any drift due to variations in environmental conditions is the same for both oscillators. Consequently, the difference between output signal frequencies due to variations in temperature and other environmental conditions remains substantially constant. As a practical matter, it has been discovered that oscillators 45 and 46 may be identical oscillators in which the frequency is controlled by varying the magnitude of an input signal. Such an oscillator is preferably characterized by an exceptionally linear relationship between the input signal amplitude and output frequency.

It has been found necessary to synchronize the pulses delivered by oscillators 45 and 46 with an external clock pulse source so that the pulses occur during mutually exclusive time intervals. If this were not done, conflicting command pulses to the differencing circuit flip-flops due to pulse coincidence would cause erroneous difference output.

To effect synchronization, the frequency of clock pulse source 47 is arranged to be higher than the highest output frequency of either oscillator 45 or oscillator 46. Delay means 48 is arranged to furnish a delay less than the time interval between pulses provided by clock pulse source 47, preferably half such time interval. Alternatively, a two-phase clock pulse generator might be utilized.

The output pulses from oscillators 45 and 46 are then used to set flip-flops 51 and 52, respectively. Each time these flip-flops are reset, they deliver a pulse to terminals 12 and 11, respectively. These output pulses occur during mutually exclusive time intervals because flip-flop 52 is reset by each pulse from clock pulse source 47 while flip-flop 51 is reset by the same pulses, but after a delay of less than the period between clock pulses. As indicated above in connection with the discussion of FIG. 1, the count electrically represented by output lines 13 is proportional to the ratio between the frequencies of the signals applied to terminals 11 and 12. Since these frequencies are in turn proportional to the signals applied to oscillators 45 and 46, it follows that the digitally encoded signal on output lines 13 is representative of the setting of potentiometer 41.

The specific transducer shown is by way of example only and might be instead a thermocouple, strain gauge or other suitable device in which a parameter is represented by the magnitude of an electrical signal. The communication link between the voltage controlled oscillators 45 and 46 and the remaining circuitry may be direct wire, a modulated carrier wave transmitted and later demodulated in a receiver, or other suitable means. Many of the flip-flops shown might be replaced by any of the numerous bistable devices known in the art.

The advantages of this telemetering system are numerous. There is no zero drift associated with the transmission of the information. The accuracy of the information transmitted is of the order of 0.1 percent.

The size and weight of the remote equipment may be exceptionally small, an especially important consideration when telemetering missile or aircraft data. The readout is in the form of a binary number in parallel electrical notation to permit easy recording of the data or immediate data processing by a large digital computing machine.

It is apparent that those skilled in the art may now make numerous modifications of and departures from the specific embodiments described herein without departing from the inventive concepts. Consequently, the invention is to be construed as limited only by the spirit and scope of the appended claims.

What is claimed is:

1. Apparatus for providing an output signal having a rate which follows the rate of an input signal comprising, a source of a reference signal, control means responsive to said reference signal to provide said output signal and control its rate, means for combining said output signal with said input signal to provide a first signal having a rate equal to the difference between the input and output signal rates, means responsive to said reference signal for providing a second signal having a rate less than that of said reference signal, means for combining said first and second signals to provide a control signal having a rate equal to the difference in the rates of said first and second signals, and means for applying said control signal to said control means to change the rate of said output signal to correspond to that of said input signal only when the latter differs from the former by at least a predetermined amount related to the rate of said second signal.

2. Apparatus for providing an output signal having a rate which follows that of an input signal comprising, a source of a reference signal, a binary rate multiplier having a rate input, an output providing said output signal, and rate control leads for receiving electrical signals in parallel binary notation effective in causing the rate of a signal applied to said rate input to be altered by a factor related to the digital number represented in parallel binary notation, means for applying said reference signal to said rate input, a counter for storing a digital number representative of the ratio between the reference signal rate and the input signal rate and delivering signals in parallel binary notation characteristic thereof to said rate control leads, means for combining said input and output signals to provide a first signal having a rate equal to the difference between rates of said input and output signals, a frequency divider energized by said reference signal and providing a second signal having a rate less than said reference signal rate divided by the number of binary digits in said stored digital number, means for combining said first and second signals to provide a control signal having a rate equal to the difference between the rates of said first and second signals, and means for applying said control signal to said counter to maintain the count therein closely representative of said ratio.

3. Apparatus in accordance with claim 2 wherein said combining means for providing said first signal includes a coarse differencing circuit energized by said input and output signals and delivering a coarse difference signal on only one of first and second coarse difference output lines when said input signal rate is respectively greater than and less than said output signal rate, a fine differencing circuit energized by the signals on said first and second coarse difference output lines and delivering said first signal on only one of first and second fine difference output lines when said coarse difference signal is provided on said first and second coarse difference output lines respectively, and buffer means energized by signals on said first and second fine difference output lines for providing said first signal.

4. Electrical apparatus comprising, a source of a reference signal, a binary rate multiplier having a rate input, an output delivering an output signal having a controllable rate, and rate control leads for receiving electrical signals in parallel binary notation effective in causing the rate of a signal applied to said rate input to be altered in frequency by a factor related to the digital number represented in parallel binary notation, means for applying said reference signal to said rate input, a reversible counter for storing a digital number representative of the ratio between the reference signal rate and the input signal rate and delivering signals in parallel binary notation characteristic thereof to said rate control leads, said counter having forward and backward lines for receiving enabling potentials causing the count stored therein to be advanced and retarded respectively when said counter is energized by count signals, means for combining said input and output signals to provide a first signal having a rate equal to the difference between rates of said input and output signals and directional control signals for enabling said forward and backward lines when said input signal rate is respectively greater than and less than said output signal rate, a frequency divider responsive to said reference signal for providing a second signal having a rate less than said reference signal rate divided by the number of digits in said stored digital number, means for combining said first and second signals to provide said count signal having a rate equal to the difference between the rates of said first and second signals, and means for applying said count signal to said reversible counter to maintain the count therein closely representative of said ratio.

5. Apparatus in accordance with claim 4 wherein said combining means for providing said first signal includes a coarse differencing circuit energized by said input and output signals and delivering a coarse difference signal on only one of first and second coarse difference output lines when said input signal rate is respectively greater than and less than said output signal rate, and a fine differencing circuit energized by the signals on said first and second coarse difference output lines and delivering said first signal on only one of first and second fine difference output lines when said coarse difference signals is provided on said first and second coarse difference output lines, respectively, and buffer means energized by signals on said first and second fine difference output lines for providing said first signal.

6. Apparatus in accordance with claim 5 and further comprising, sources of first and second pulse trains, and means responsive to said first and second pulse trains for providing said reference signal and said input signal respectively whereby the reference signal rate and the input signal rate correspond respectively to the first pulse train rate and the second pulse train rate, pulses of said input signal and pulses of said reference signal occurring in mutually exclusive time intervals.

7. Apparatus in accordance with claim 6 wherein said means responsive to said first and second pulse trains includes a source of clock pulses having a rate higher than the rate of said first and second pulse trains, and first and second bistable devices respectively set by said first train pulses and said second train pulses and respectively reset by said clock pulses and said clock pulses delayed by a time interval less than the time spacing between clock pulses.

8. In a frequency meter of the type having a reversible counter whose output is fed into the multiplier input of a binary rate multiplier having a reference frequency applied to its rate input, pulse rate difference means for comparing the output of the binary rate multiplier with the rate of the input signal whose frequency is to be determined, and the pulse rate difference means providing the signals to the forward and backward inputs of the reversible counter, the improvement comprising: means for obtaining from the pulse rate difference means an error signal indicative of the difference in rates of the compared signals, means coupled to the binary rate multiplier for providing a first signal whose rate is equal to half the rate represented by the least significant digit of the reversible counter, and stabilizing means for comparing the error signal with the first signal, the stabilizing means having its output coupled to permit the reversible counter to change its count only when the error signal exceeds the first signal.

References Cited in the file of this patent

UNITED STATES PATENTS

| | | |
|---|---|---|
| 2,490,500 | Young | Dec. 6, 1949 |
| 2,672,284 | Dickinson | Mar. 16, 1954 |
| 2,743,419 | Chatterton | Apr. 24, 1956 |
| 2,836,356 | Forrest | May 27, 1958 |
| 2,905,895 | Gordon | Sept. 22, 1959 |
| 2,925,555 | Gordon | Feb. 16, 1960 |